US012615799B2

(12) United States Patent
Liu

(10) Patent No.: US 12,615,799 B2
(45) Date of Patent: Apr. 28, 2026

(54) SEMICONDUCTOR STRUCTURE WITH INCREASED CHANNEL LENGTH AND METHOD FOR FORMING THE SAME

(71) Applicant: CHANGXIN MEMORY TECHNOLOGIES, INC., Hefei City (CN)

(72) Inventor: Xiang Liu, Hefei (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 548 days.

(21) Appl. No.: 18/161,119

(22) Filed: Jan. 30, 2023

(65) Prior Publication Data

US 2023/0178645 A1 Jun. 8, 2023

Related U.S. Application Data

(63) Continuation of application No. PCT/CN2022/071510, filed on Jan. 12, 2022.

(30) Foreign Application Priority Data

Aug. 25, 2021 (CN) .......................... 202110980822.0

(51) Int. Cl.
*H10D 30/66* (2025.01)
*H10D 30/01* (2025.01)
(Continued)

(52) U.S. Cl.
CPC ....... *H10D 30/663* (2025.01); *H10D 30/0291* (2025.01); *H10D 62/292* (2025.01); *H10D 64/252* (2025.01); *H10D 64/518* (2025.01)

(58) Field of Classification Search
CPC .. H10D 30/611; H10D 30/615; H10D 30/023; H10D 84/014–0142; H10D 84/0177; H10D 30/62–6219; H10D 30/024–0245; H10D 84/0158; H10D 84/0193; H10D 86/011; H10D 84/834; H10D 84/853; H10D 86/215; H10D 30/63; H10D 84/016; H10D 84/0195;
(Continued)

(56) References Cited

U.S. PATENT DOCUMENTS

| | | | | |
|---|---|---|---|---|
| 6,175,128 | B1 * | 1/2001 | Hakey | H10B 12/37 257/E21.507 |
| 6,380,027 | B2 * | 4/2002 | Furukawa | H10B 12/34 438/296 |

(Continued)

FOREIGN PATENT DOCUMENTS

| | | |
|---|---|---|
| CN | 101335241 A | 12/2008 |
| CN | 104425591 A | 3/2015 |

(Continued)

*Primary Examiner* — Maliheh Malek
(74) *Attorney, Agent, or Firm* — Syncoda LLC; Feng Ma

(57) ABSTRACT

A method for forming a semiconductor structure includes the following operations. A substrate is formed. The substrate includes a body part and a protrusion part located on a surface of the body part. A gate electrode located on the body part and distributed around sidewalls of the protrusion part is formed. A first doped region and a second doped region located in the body part and distributed at two opposite sides of the gate electrode are formed.

15 Claims, 15 Drawing Sheets

(51) Int. Cl.
*H10D 62/17* (2025.01)
*H10D 64/23* (2025.01)
*H10D 64/27* (2025.01)

(58) Field of Classification Search
CPC ...................... H10D 62/292; H01L 21/28114; H10B 12/36; H10B 12/056; H10B 63/34
See application file for complete search history.

(56) References Cited

U.S. PATENT DOCUMENTS

| | | | | |
|---|---|---|---|---|
| 6,661,057 B1 * | 12/2003 | Dawson | ............ | H01L 21/28518 257/E29.264 |
| 7,531,412 B2 | 5/2009 | Yoon | | |
| 8,076,673 B2 * | 12/2011 | Kreipl | .................... | H10B 20/25 257/209 |
| 8,154,065 B2 | 4/2012 | Yoon | | |
| 8,486,808 B2 | 7/2013 | Nojima | | |
| 8,536,642 B2 * | 9/2013 | Ogawa | ................. | H10D 30/025 257/E29.183 |
| 10,177,153 B2 * | 1/2019 | Kang | ..................... | H10B 12/056 |
| 10,475,889 B1 * | 11/2019 | Li | ........................ | H10D 30/6735 |
| 10,504,889 B1 * | 12/2019 | Anderson | .............. | B82Y 10/00 |
| 10,811,418 B2 * | 10/2020 | Kim | ........................ | H10B 12/03 |
| 11,239,118 B2 | 2/2022 | Kim | | |
| 11,728,433 B2 * | 8/2023 | Li | ........................ | H10D 84/038 257/288 |
| 11,777,012 B2 * | 10/2023 | Chen | ..................... | H01L 21/027 438/283 |
| 12,183,823 B2 * | 12/2024 | Lin | ................... | H01L 21/28247 |
| 12,191,388 B2 * | 1/2025 | Mignot | ............... | H10D 62/151 |
| 2006/0097304 A1 * | 5/2006 | Yoon | .................... | H10D 30/025 257/E21.655 |
| 2007/0029619 A1 * | 2/2007 | Kim | .................. | H01L 21/28114 257/E21.429 |
| 2007/0057301 A1 * | 3/2007 | Wang | ................ | H01L 21/28114 257/296 |
| 2007/0057325 A1 * | 3/2007 | Hsu | ...................... | H10D 30/024 257/E29.13 |
| 2007/0096182 A1 * | 5/2007 | Schloesser | ............ | H10D 30/62 257/E21.654 |
| 2007/0215915 A1 * | 9/2007 | Wang | ................. | H10D 30/0221 257/E29.054 |
| 2008/0296677 A1 * | 12/2008 | Takaishi | ................. | H10D 30/63 257/E29.268 |
| 2009/0004813 A1 * | 1/2009 | Lee | ...................... | H10D 30/025 438/421 |
| 2009/0042347 A1 * | 2/2009 | Oyu | ..................... | H10D 64/516 257/E27.096 |
| 2009/0085088 A1 * | 4/2009 | Takaishi | .............. | H10D 84/016 257/314 |
| 2009/0090985 A1 * | 4/2009 | Kim | .................. | H01L 21/28114 257/E21.177 |
| 2009/0189217 A1 | 7/2009 | Yoon | | |
| 2011/0012193 A1 * | 1/2011 | Nojima | ................ | H10D 30/025 257/302 |
| 2011/0121374 A1 * | 5/2011 | Ogawa | ................. | H10B 12/053 257/329 |
| 2011/0263099 A1 * | 10/2011 | Nojima | ................ | H10D 30/025 438/586 |
| 2012/0001256 A1 * | 1/2012 | Nojima | .................. | H10B 12/09 257/E29.264 |
| 2012/0049261 A1 * | 3/2012 | Fujimoto | .............. | H10B 12/31 257/E29.345 |
| 2012/0080742 A1 * | 4/2012 | Fujimoto | ........... | G11C 11/4085 257/329 |
| 2012/0261736 A1 * | 10/2012 | Hsu | ...................... | H10D 64/035 257/E21.409 |
| 2013/0270629 A1 * | 10/2013 | Ikebuchi | .............. | H10D 62/126 257/329 |
| 2013/0320434 A1 * | 12/2013 | Shin | .................. | H01L 21/02636 257/329 |
| 2014/0061775 A1 * | 3/2014 | Chuang | .............. | H10D 84/0172 257/329 |
| 2014/0091385 A1 * | 4/2014 | Masuoka | ............. | H10D 30/025 257/329 |
| 2014/0131812 A1 * | 5/2014 | Wu | .................... | H10D 84/0158 257/401 |
| 2015/0187915 A1 * | 7/2015 | Joo | ........................ | H10D 30/62 438/289 |
| 2015/0270268 A1 * | 9/2015 | Fujikawa | .............. | H10D 30/63 257/329 |
| 2015/0318365 A1 * | 11/2015 | Cheng | ................. | H10D 64/027 257/330 |
| 2016/0013297 A1 * | 1/2016 | Lu | ........................ | H10D 30/601 438/283 |
| 2016/0111362 A1 * | 4/2016 | Takaishi | .............. | H10D 62/115 257/334 |
| 2017/0148897 A1 * | 5/2017 | Cheng | .................... | H10D 30/63 |
| 2017/0278884 A1 * | 9/2017 | Yang | ................ | H01L 21/28114 |
| 2018/0033791 A1 * | 2/2018 | Kang | ..................... | H10B 12/30 |
| 2019/0081174 A1 * | 3/2019 | You | ...................... | H10D 64/018 |
| 2019/0165175 A1 * | 5/2019 | More | .................. | H10D 30/608 |
| 2021/0020761 A1 * | 1/2021 | Tsai | ................... | H10D 84/038 |
| 2021/0082767 A1 * | 3/2021 | Kim | .................... | H10B 12/053 |
| 2021/0391455 A1 * | 12/2021 | Lin | .................... | H10D 30/6219 |
| 2021/0408267 A1 * | 12/2021 | Chen | ................. | H01L 21/0334 |
| 2022/0359743 A1 * | 11/2022 | Lin | .................... | H10D 30/6219 |
| 2022/0384634 A1 * | 12/2022 | Baringhaus | .......... | H10D 30/025 |
| 2023/0010950 A1 * | 1/2023 | Sun | ........................ | H10D 30/63 |
| 2023/0017879 A1 * | 1/2023 | Li | .......................... | H10D 84/83 |
| 2023/0099767 A1 * | 3/2023 | Cheng | ................... | H10D 30/63 257/288 |
| 2023/0101235 A1 * | 3/2023 | Xie | ..................... | H10D 84/0128 438/396 |
| 2023/0187442 A1 * | 6/2023 | Fan | ...................... | H10D 30/024 257/288 |
| 2023/0282482 A1 * | 9/2023 | Shen | ...................... | H10D 30/62 |
| 2023/0363139 A1 * | 11/2023 | Liu | ......................... | H10D 30/60 |
| 2023/0377991 A1 * | 11/2023 | Lin | ................... | H10D 30/6212 |
| 2023/0411412 A1 * | 12/2023 | Xiao | ..................... | H10B 12/05 |
| 2024/0030289 A1 * | 1/2024 | Cho | ...................... | H10D 62/115 |
| 2024/0072170 A1 * | 2/2024 | Yin | ..................... | H10D 64/518 |
| 2024/0105795 A1 * | 3/2024 | Liu | .................. | H01L 21/28088 |
| 2024/0304672 A1 * | 9/2024 | Lu | ........................ | H10D 62/292 |
| 2024/0429317 A1 * | 12/2024 | Po-Kai | ............. | H01L 21/02236 |

FOREIGN PATENT DOCUMENTS

| | | |
|---|---|---|
| CN | 109817619 A | 5/2019 |
| CN | 112599411 A | 4/2021 |
| CN | 112670344 A | 4/2021 |
| JP | H098295 A | 1/1997 |

* cited by examiner

SEMICONDUCTOR STRUCTURE WITH INCREASED CHANNEL LENGTH AND METHOD FOR FORMING THE SAME

CROSS-REFERENCE TO RELATED APPLICATIONS

This application is a U.S. continuation application of International Application No. PCT/CN2022/071510, filed Jan. 12, 2022, which claims priority to Chinese Patent Application No. 202110980822.0, filed Aug. 25, 2021. International Application No. PCT/CN2022/071510 and Chinese Patent Application No. 202110980822.0 are incorporated herein by reference in their entireties.

BACKGROUND

Dynamic random access memory (DRAM) is a semiconductor structure commonly used in electronic devices such as computers. It is composed of multiple memory cells, and each of the memory cells usually includes a transistor and a capacitor. In the transistor, the gate is electrically connected with a word line, the source is electrically connected with a bit line, and the drain is electrically connected with the capacitor. A word line voltage on the word line can control on and off of the transistor, so that data information stored in the capacitor can be read or data information can be written into the capacitor through the bit line.

A dynamic random access memory usually includes an array region and a core region located outside the array area. The array region has a plurality of memory cells arranged in an array, and the core region has a plurality of control devices for applying control signals to the memory cells in the array region. An area of the core region accounts for about 20% of an area of a whole chip. In order to reduce a size of the chip and improve integration, a MOS device in the core region is usually manufactured in a small size, belongs to a short-channel device, has a large short-channel current effect and has a serious leakage problem.

Therefore, how to reduce the short-channel effect and leakage of the MOS devices in the semiconductor structure, so as to improve the electrical properties and the yield of the semiconductor structure, is an urgent technical problem to be solved at present.

SUMMARY

The disclosure relates to the technical field of manufacturing semiconductors, and in particular to a semiconductor structure and a method for forming the same.

According to some embodiments of the disclosure, in an aspect, the disclosure provides a method for forming a semiconductor structure, including the following operations.

A substrate is formed. The substrate includes a body part and a protrusion part located on a surface of the body part.

A gate electrode located on the body part and distributed around sidewalls of the protrusion part is formed.

A first doped region and a second doped region located in the body part and distributed at two opposite sides of the gate electrode are formed.

According to some embodiments of the disclosure, in another aspect, the disclosure provides a semiconductor structure, including a substrate, a gate electrode, a first doped region and a second doped region.

The substrate includes a body part and a protrusion part located on a surface of the body part.

The gate electrode is located on the body part and are distributed around sidewalls of the protrusion part.

A first doped region is located in the body part.

A second doped region is located in the body part. The first doped region and the second doped region are distributed at two opposite sides of the gate electrode.

DETAILED DESCRIPTION

Specific implementations of the semiconductor structure and the method for forming the same provided by the present disclosure will be described in detail below in combination with the accompany drawings.

Figure 1:
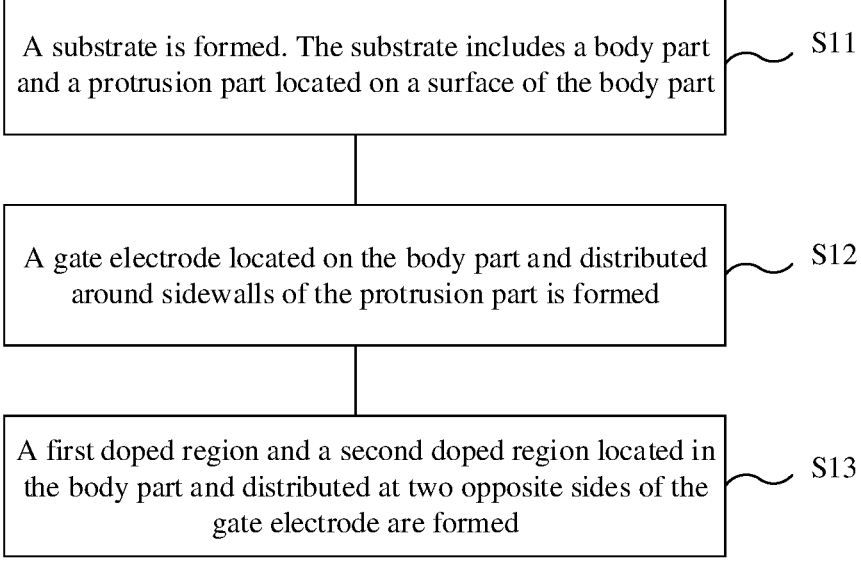
FIG. 1 is a flowchart of a method for forming a semiconductor structure in a specific implementation of the disclosure.
Figure 2A:
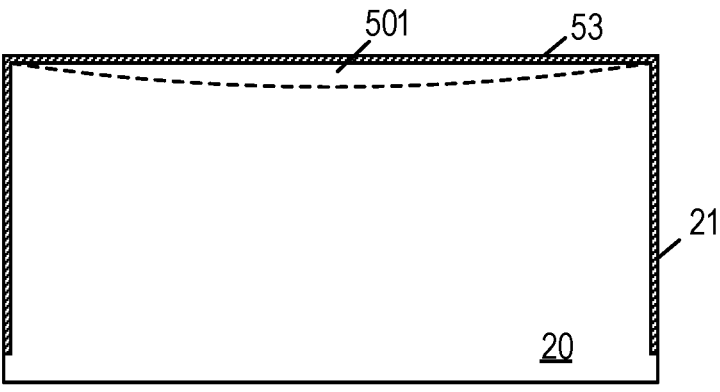
FIGS. 2A-2Z are main schematic process cross-section diagrams in a process of forming a semiconductor structure in a specific implementation of the disclosure.
Figure 2B:
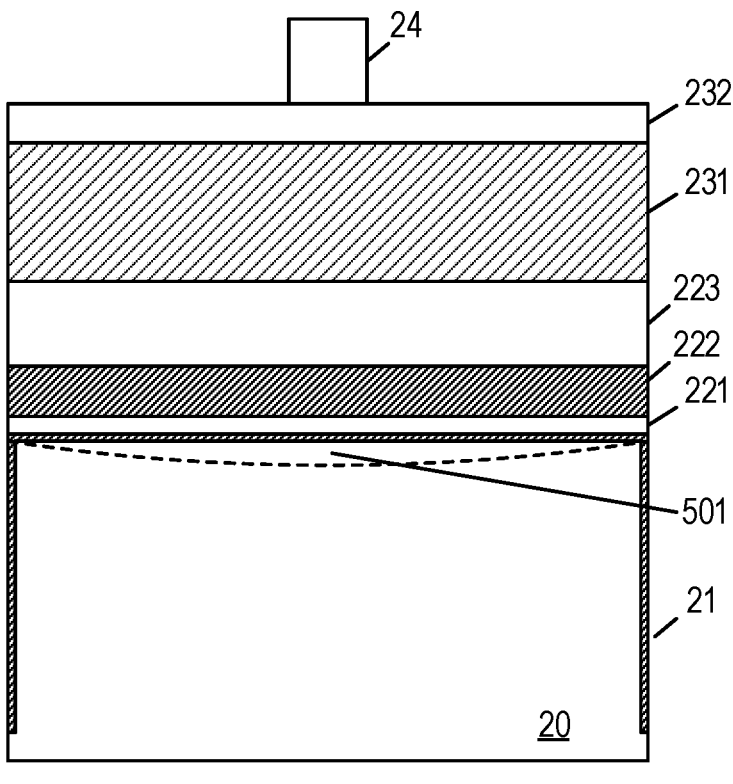
Figure 2C:
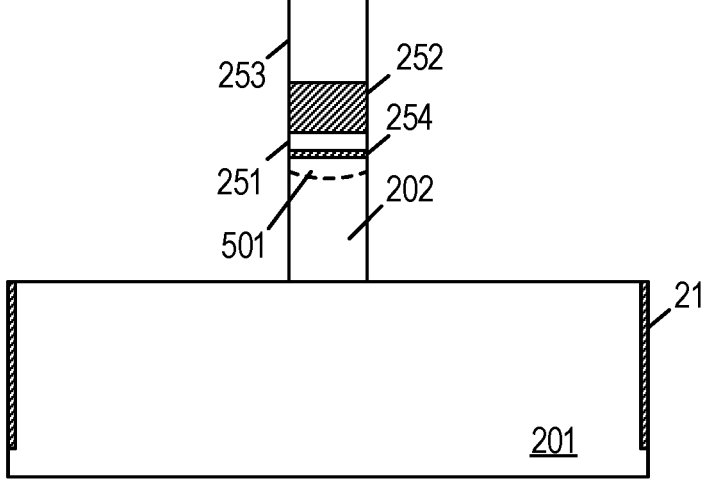
Figure 2D:
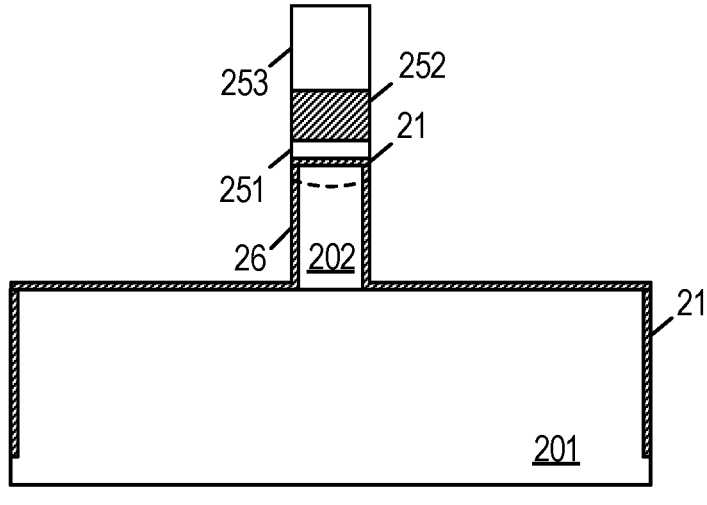
Figure 2E:
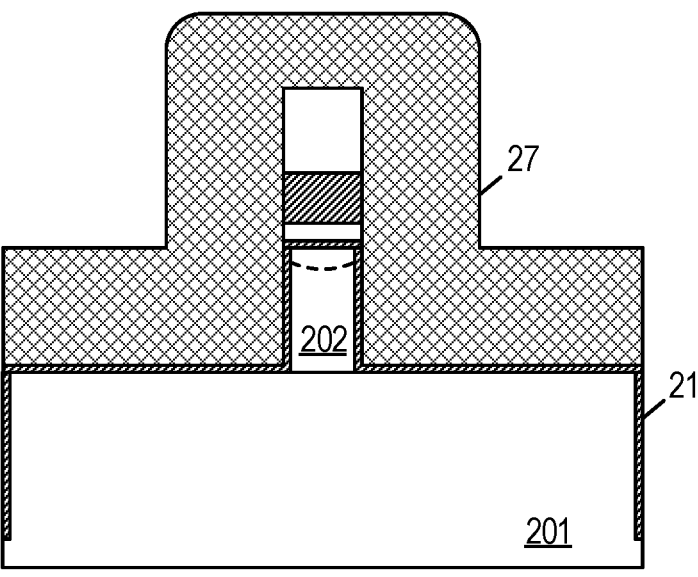

Specific implementations provide a semiconductor structure. FIG. 1 is a flowchart of a method for forming a semiconductor structure in a specific implementation of the disclosure. FIGS. 2A-2Z are main schematic process cross-section diagrams in a process of forming a semiconductor structure in a specific implementation of the disclosure. As shown in FIGS. 1 and 2A-2Z, the method for forming a semiconductor structure provided by the specific implementations includes specifically the following operations.

In S11, a substrate is formed. The substrate includes a body part 201 and a protrusion part 202 on a surface of the body part, as shown in FIG. 2C.

In some embodiments, the formation of the substrate includes specifically the following operations.

An initial substrate 20 is provided. The initial substrate includes a first lightly doped region 501 as shown in FIG. 2A.

An initial insulating layer covering a surface of the initial substrate 20 is formed.

The substrate including a body part 201 and the protrusion part 202 on a surface of the body part 201, and an insulating layer on the surface of the protrusion part 202 are formed by etching the initial insulating layer and the initial substrate 20. The protrusion part 202 includes the first lightly doped region, and the body part does not include the first lightly doped region.

Specifically, the initial substrate 20 may be, but is not limited to, a silicon substrate. The specific implementation is illustrated by an example where the initial substrate 20 is a silicon substrate. In other examples, the initial substrate 20 may also be a semiconductor substrate such as gallium nitride, gallium arsenide, gallium carbide, silicon carbide or SOI. A plurality of active areas are provided in the initial substrate 20, and adjacent active areas are isolated from each other by shallow trench isolation structures 21. A surface of the initial substrate 20 is also covered with a substrate isolation layer 53 as shown in FIG. 2A. After performing a surface activation treatment on the initial substrate 20, ion implantation is performed on the active areas in the initial substrate 20 to form a well region. After the well region is formed, a first doping ion may also be implanted into the initial substrate 20 to form the first lightly doped region 501. The first lightly doped region 501 is located at least at a position where a protrusion part 202 is pre-formed. In order to reduce the number of masks, in an example, the first doping ion may be implanted into the entire initial substrate 20, thereby forming the first lightly doped region 501 in the entire initial substrate 20. Materials of the substrate isolation layer 53 and the shallow trench isolation structures 21 may both be an oxide material, such as silicon dioxide.

The initial insulating layer may be a single-layer structure or a multi-layer structure. The specific implementation is illustrated by an example where the initial insulating layer is a multi-layer structure. After the well region is formed in the initial substrate 20, a first sub-initial insulating layer 221, a second sub-initial insulating layer 222, and a third sub-initial insulating layer 223 may be deposited on the surface of the initial substrate 20 sequentially by a chemical vapor deposition process, a physical vapor deposition process, or an atomic layer deposition process. A material of the first sub-initial insulating layer 221 may be a nitride (e.g. silicon nitride) or an oxynitride (e.g. silicon oxynitride). A material of the second sub-initial insulating layer 222 may be an oxide material (e.g. silicon dioxide). A material of the third sub-initial insulating layer 223 may be a nitride material (e.g. silicon nitride). Then, a first sub-mask layer 231 is deposited on a surface of the third sub-initial insulating layer 223, a second sub-mask layer 232 is deposited on a surface of the first sub-mask layer 231, and a patterned first photoresist layer 24 is formed on a surface of the second sub-mask layer 232, as shown in FIG. 2B. Thereafter, a pattern in the first photoresist layer 24 is transferred downward. Part of the second sub-mask layer 232, part of the first sub-mask layer 231, part of the third sub-insulating layer 223, part of the second sub-insulating layer 222, part of the first sub-insulating layer 221, part of the substrate isolation layer 53 and part of the initial substrate 20 are etched off. The remaining second sub-mask layer 232 and the remaining first sub-mask layer 231 are stripped off to obtain a structure as shown in FIG. 2C. The remaining first sub-initial insulating layer 221 constitutes a first sub-insulating layer 251. The remaining second sub-initial insulating layer 222 constitutes a second sub-insulating layer 252. The remaining third sub-initial insulating layer 223 constitutes a third sub-insulating layer 253. The remaining substrate isolation layer 53 constitutes a fourth sub-insulating layer 254. A height of the etched initial substrate 20 is greater than a depth of the first lightly doped region 501, such that the first lightly doped region 501 is absent from the body part 201 formed after etching and the first lightly doped region 501 remains in the protrusion part 202.

The specific height of the protrusion part 202 may be set according to actual needs by those skilled in the art. The height of the protrusion part 202 should not be too large; otherwise the overall size of the semiconductor structure is increased. The height of the protrusion part 202 should not be too small; otherwise the channel length cannot be effectively increased. In some embodiments, the height of the protrusion part 202 is 30 nm to 100 nm. The height of the protrusion part 202 in the specific implementation refers to the height of the protrusion part 202 in the direction perpendicular to the surface of the body part 201.

The specific implementation is illustrated by an example where a cross-sectional shape of the protrusion part 202 is rectangular. In other specific implementations, a person skilled in the art can also adjust the shape of the protrusion part 202 according to actual needs.

Figure 2F:
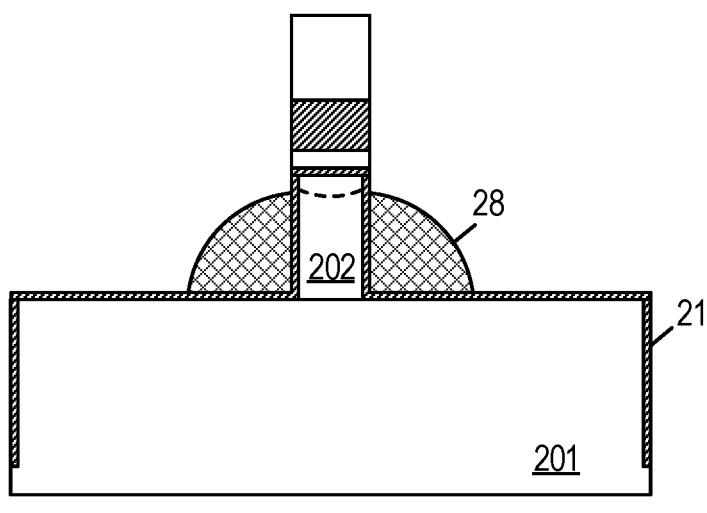
Figure 2G:
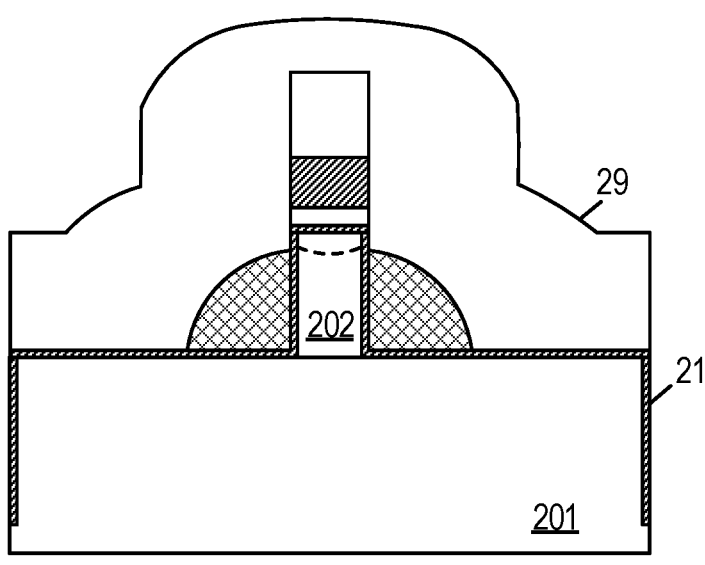
Figure 2H:
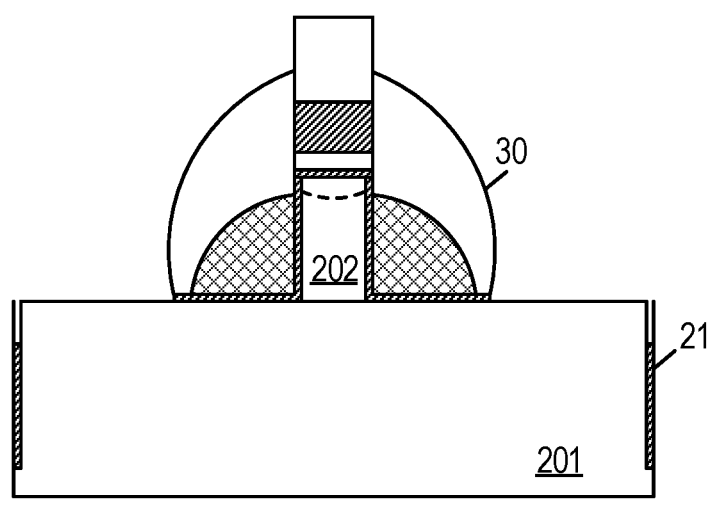
Figure 2I:
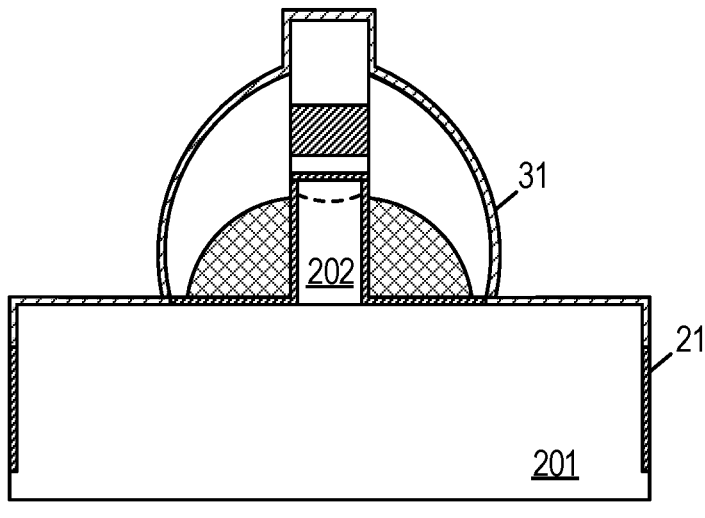
Figure 2J:
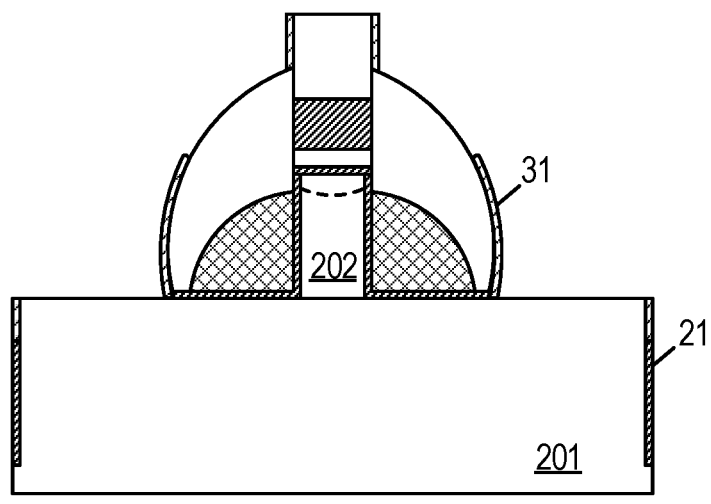
Figure 2K:
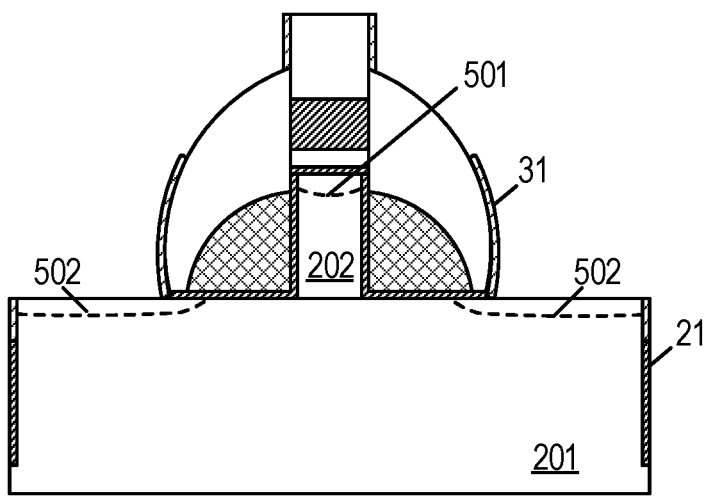
Figure 2L:
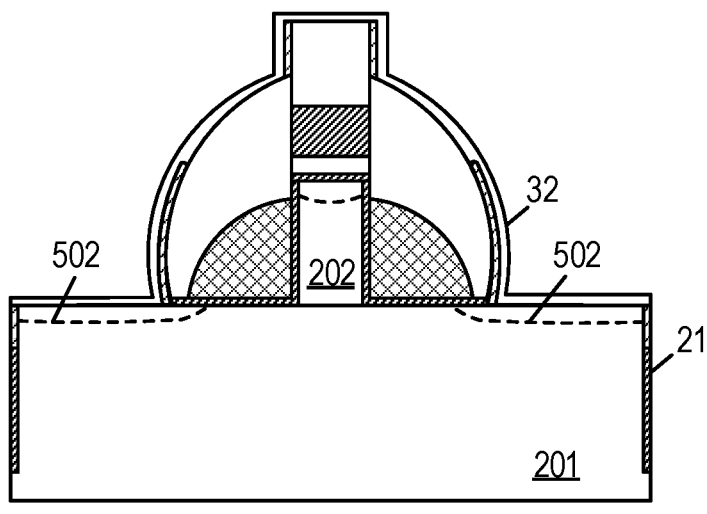

In S21, a gate electrode 28 located on the body part 201 and distributed around sidewalls of the protrusion part 202 is formed, as shown in FIG. 2F.

In some embodiments, the formation of the gate electrode 28 located on the body part 201 and distributed around sidewalls of the protrusion part 202 includes specifically the following operations.

A gate dielectric layer 26 covering the sidewalls of the protrusion part 202 and part of the surface of the body part 201 is formed, as shown in FIG. 2D.

The gate electrode 28 located on a surface of the gate dielectric layer 26 and distributed around the sidewalls of the protrusion part 202 is formed.

In some embodiments, the formation of the gate electrode 28 located on a surface of the gate dielectric layer 26 and distributed around the sidewalls of the protrusion part 202 includes specifically the following operations.

A gate material layer 27 is deposited on the surface of the gate dielectric layer and the surface of the insulating layer, as shown in FIG. 2E.

All the gate material layer 27 on the surface of the insulating layer and part of the gate material layer 27 above the body part are removed, such that the gate material layer 27 remaining on the surface of the gate dielectric layer 26 and distributed around the sidewalls of the protrusion part 202 forms the gate electrode 28, as shown in FIG. 2F.

Specifically, after forming the protrusion part 202, an oxide layer may be grown as the gate dielectric layer 26 on the surface of the body part 201 and the sidewalls of the protrusion part 202 by an in-situ steam generation (ISSG) process, as shown in FIG. 2D. Then, a material such as polysilicon is deposited on a surface of the gate dielectric layer 26 and the surface of the insulating layer to form a gate material layer 27, as shown in FIG. 2E. Next, ion implantation is performed on the gate material layer 27. Also all the gate material layer 27 on the surface of the insulating layer and part of the gate material layer 27 above the body part are removed, such that the gate material layer 27 remaining on the surface of the gate dielectric layer 26 and distributed around the sidewalls of the protrusion part 202 forms the gate electrode 28, as shown in FIG. 2F.

In some embodiments, a height of the gate electrode 28 is smaller than a height of the protrusion part 202 in the direction perpendicular to the surface of the body part 201.

The height of the gate electrode 28 refers to the height of the gate electrode 28 in the direction perpendicular to the surface of the body part 201. The setting of the height of the gate electrodes 28 to be smaller than the height of the protrusion part 202 is helpful to reduce an internal resistance of the gate electrode 28 on the one hand, and facilitates isolation of the gate electrode 28 from other device structures on another hand.

Figure 2M:
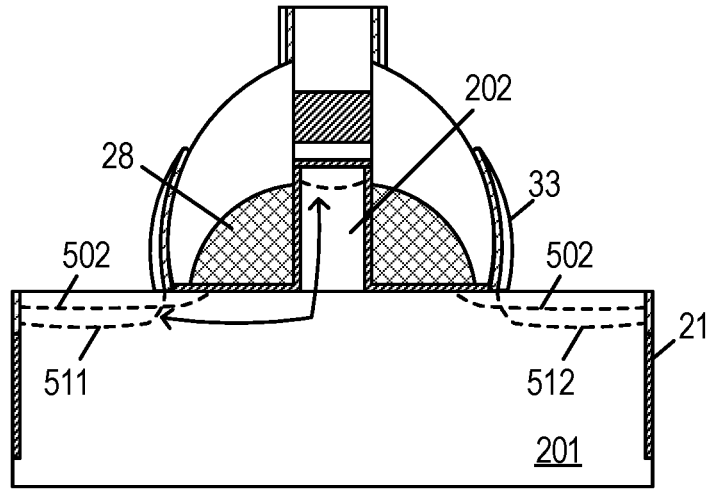
Figure 2N:
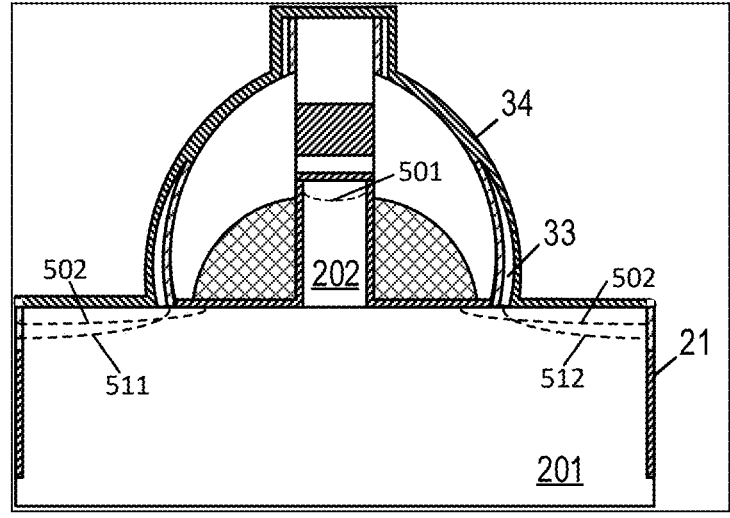
Figure 2O:
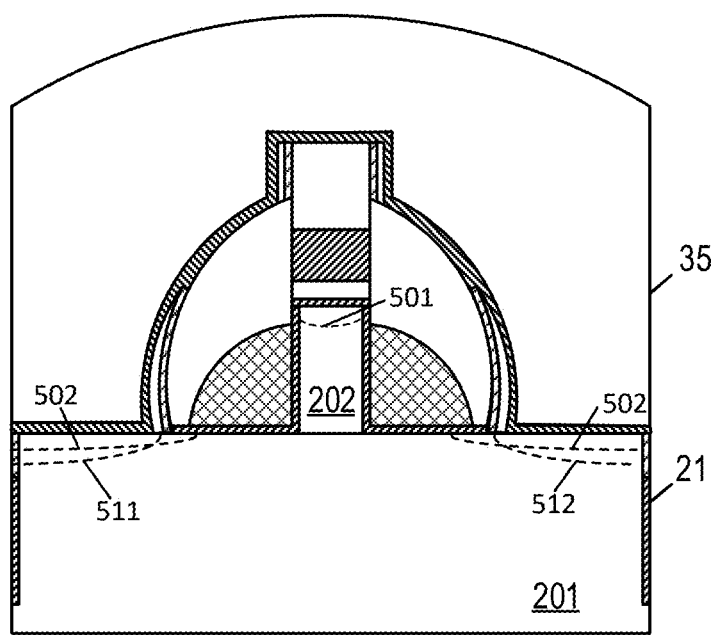
Figure 2P:
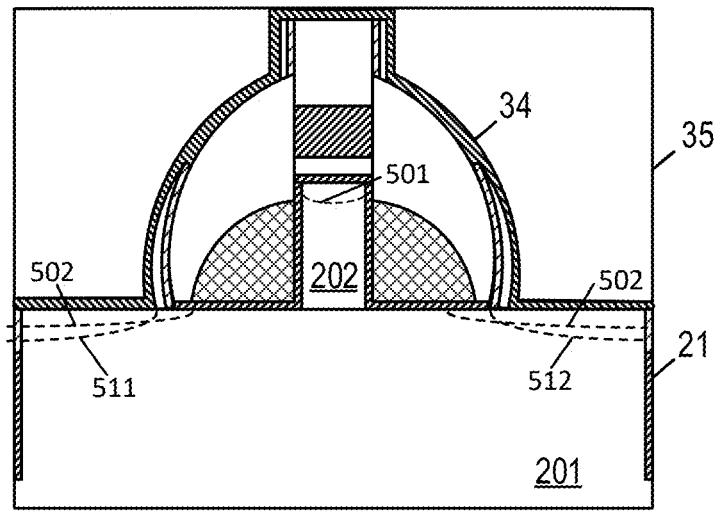
Figure 2Q:
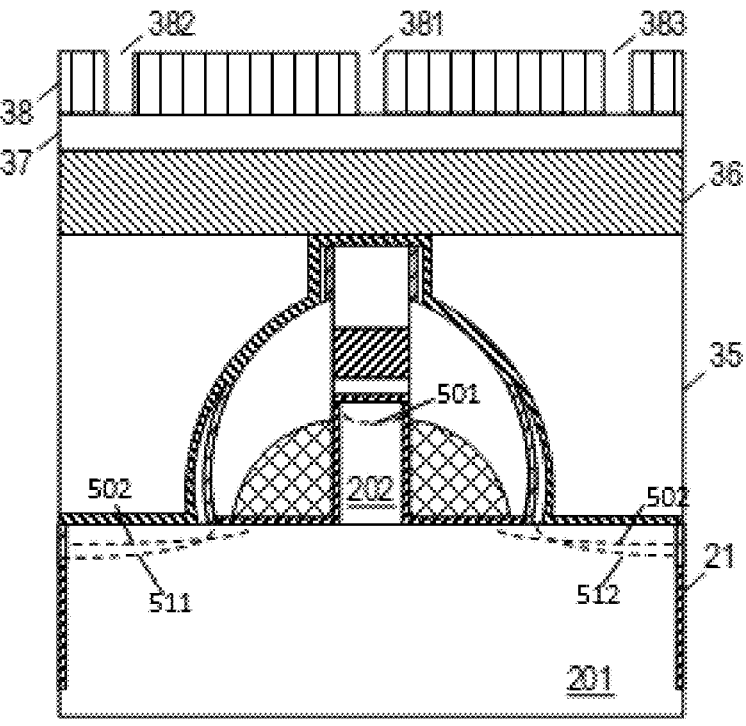

In S13, a first doped region 511 and a second doped region 512 located in the body part 201 and distributed at two opposite sides of the gate electrode 28 are formed, as shown in FIG. 2M.

Specifically, as shown in FIG. 2M, the gate electrode 28 is arranged around a periphery of the protrusion part 202. The first doped region 511 and the second doped region 512 are distributed in the body part 201 at two opposite sides of the gate electrode 28, so that the channel length is shown by a double-headed arrow in FIG. 2M, thereby increasing the channel length and thus reducing the leakage current. Moreover, an increase in the channel length can bring an increase in an area of the channel region, which reduces a threshold voltage mismatch caused by a process deviation.

In some embodiments, before forming a first doped region 511 and a second doped region 512 located in the body part

201 and distributed at two opposite sides of the gate electrode 28, the method further includes the following operations.

A first dielectric layer 30 covering the gate electrode 28 is formed, as shown in FIG. 2H.

The first doping ion is implanted into the body part 201 at the two opposite sides of the protrusion part 202 to form second lightly doped regions 502, as shown in FIG. 2K.

Specifically, after forming the gate electrode 28, an oxide material (e.g., silicon dioxide) is deposited on the surface of the body part 201, the surface of the gate electrode 28 and the surface of the insulating layer, so as to form a first initial dielectric layer 29 as shown in FIG. 2G. Next, the first initial dielectric layer 29 is etched to remove part of the first initial dielectric layer 29 on a top surface and part of a sidewall surface of the insulating layer and on the surface of the body part 201, such that the first initial dielectric layer 29 remaining on the surface of the gate electrode 28 forms a first dielectric layer 30, as shown in FIG. 2H. When a material of the first initial dielectric layer 29 is the same as that of the shallow trench isolation structures 21, part of the shallow isolation layer trench 21 is also removed during removing the first initial dielectric layer 29. Next, a nitride material (e.g. silicon nitride) is deposited on a surface of the first dielectric layer 30, the surface of the insulating layer, the surface of the body part 201 and surfaces of the shallow trench isolation structures 21 to form a first isolation layer 31, as shown in FIG. 2I. Then, the first isolation layer 31 covering the surface of the insulating layer and the surface of the body part 201, as well as part of the first isolation layer 31 on the surface of the first dielectric layer 30 are removed by etching. Part of the first isolation layer 31 is remained on the surface of the first dielectric layer 30, as shown in FIG. 2J.

Then, the first doping ion is implanted into the body part 201 at the two opposite sides of the protrusion part 202 to form second lightly doped regions 502, as shown in FIG. 2K.

In some embodiments, the formation of the first doped region 511 and the second doped region 512 located in the body part 201 and distributed at two opposite sides of the gate electrode 28 includes specifically the following operations.

The first doped region and the second doped region are formed respectively in the body part 201 at the two opposite sides of the gate electrode 28 by implanting a second doping ion into the body part 201 at the two opposite sides of the protrusion part 202.

In some embodiments, the projections of the second lightly doped regions 502 partially overlap with the projection of the first doped region 511 and the projection of the second doped region 512 respectively in a direction perpendicular to the surface of the Specifically, after forming the second lightly doped regions 502, by depositing a material such as an oxide on the surface of the body part, the surface of the insulating layer, the surface of the first dielectric layer 30 and the surface of the first isolation layer 31, a second initial isolation layer 32 is formed, as shown in FIG. 2L. Next, part of the second initial isolation layer 32 on the surface of the body part 201, the surface of the first dielectric layer 30 and the top surface of the insulating layer is etched off, such that the second initial isolation layer 32 remaining on the surface of the first isolation layer 31 and the sidewalls of the insulating layer forms a second isolation layer 33, as shown in FIG. 2M. Then, by implanting the second doping ion into the body part 201 at the two opposite sides of the protrusion part 202, the first doped region 511 and the second doped region 512 are formed, as shown in FIG. 2M. The first doped region 511 is a source region, and correspondingly, the second doped region 512 is a drain region. Alternatively, the first doped region 511 is the drain region, and correspondingly, the second doped region 512 is the source region.

In some embodiments, after forming the first doped region 511 and the second doped region 512 located in the body part 201 and distributed at two opposite sides of the gate electrode 28, the method further includes the following operations.

A second dielectric layer 35 covering the surface of the body part 201, the surface of the first dielectric layer 30, and the surface of the insulating layer is formed.

Figure 2R:
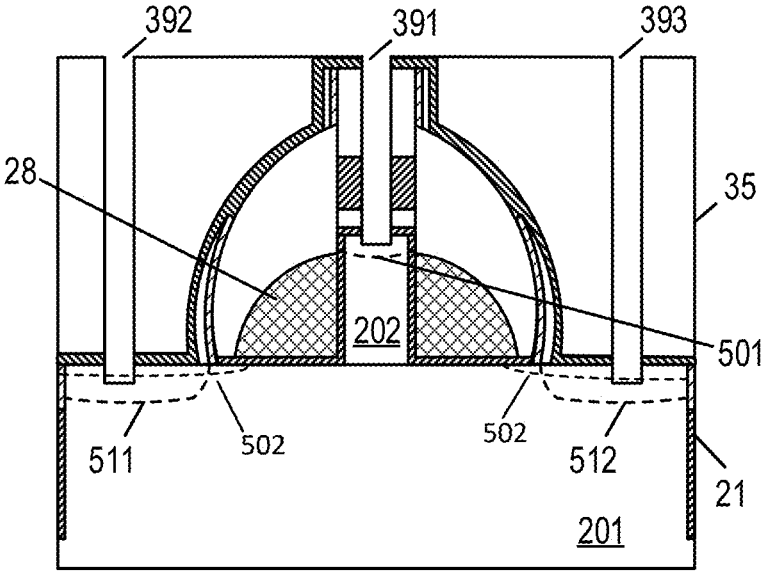
Figure 2S:
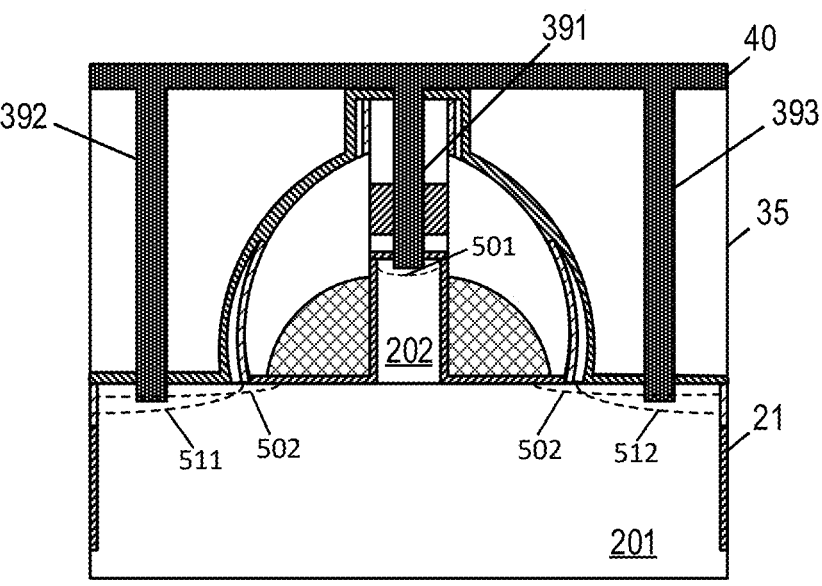
Figure 2T:
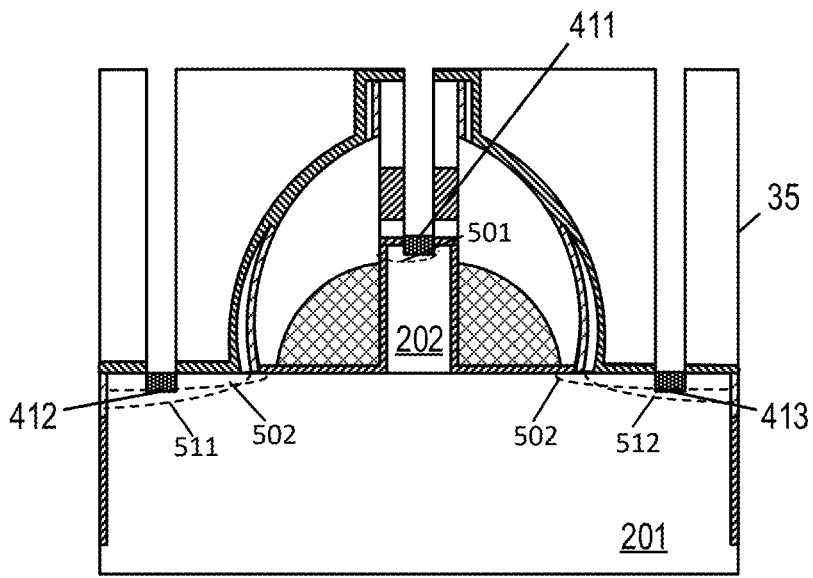
Figure 2U:
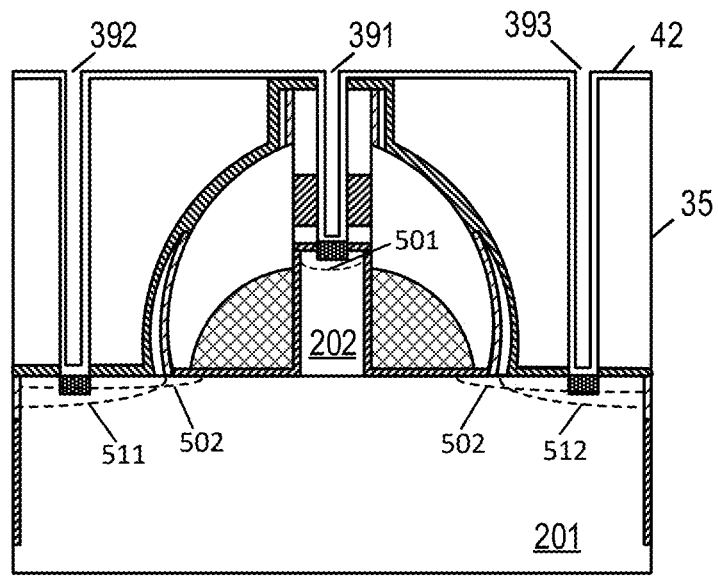
Figure 2V:
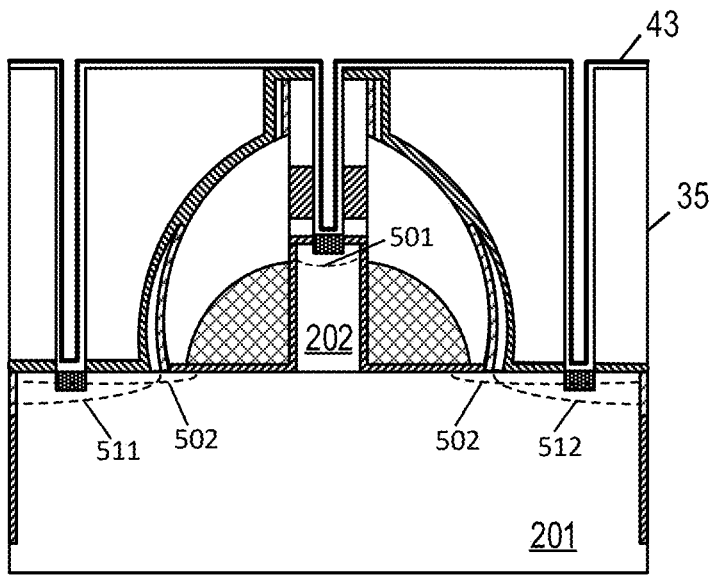
Figure 2W:
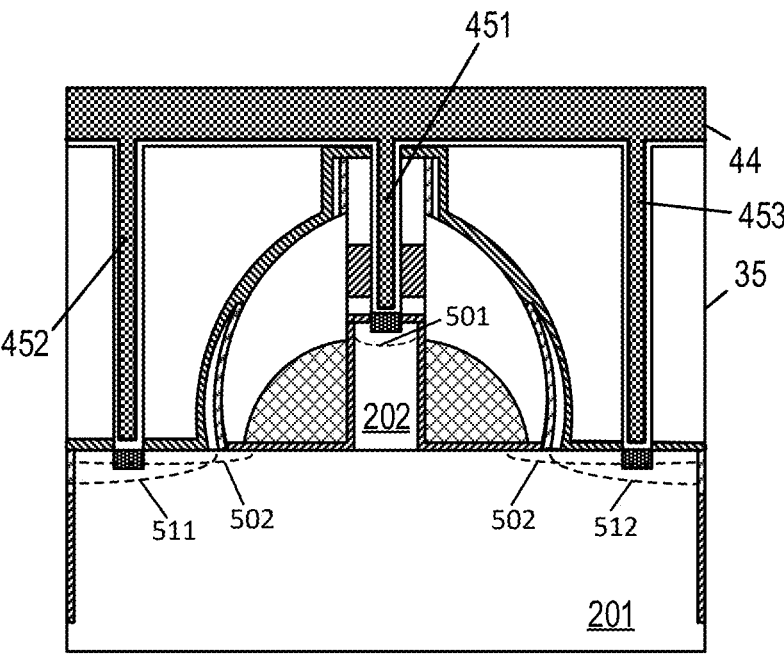

By etching the second dielectric layer 35, the first dielectric layer 30 and the insulating layer, a first through hole 391 exposing the first lightly doped region 501 in the protrusion part 202, a second through hole 392 exposing the first doped region 511 in the body part 201, a third through hole 393 exposing the second doped region 512 in the body part and fourth through holes (not shown in the figure) exposing the gate electrode 28 are formed, as shown in FIG. 2R.

Figure 2X:
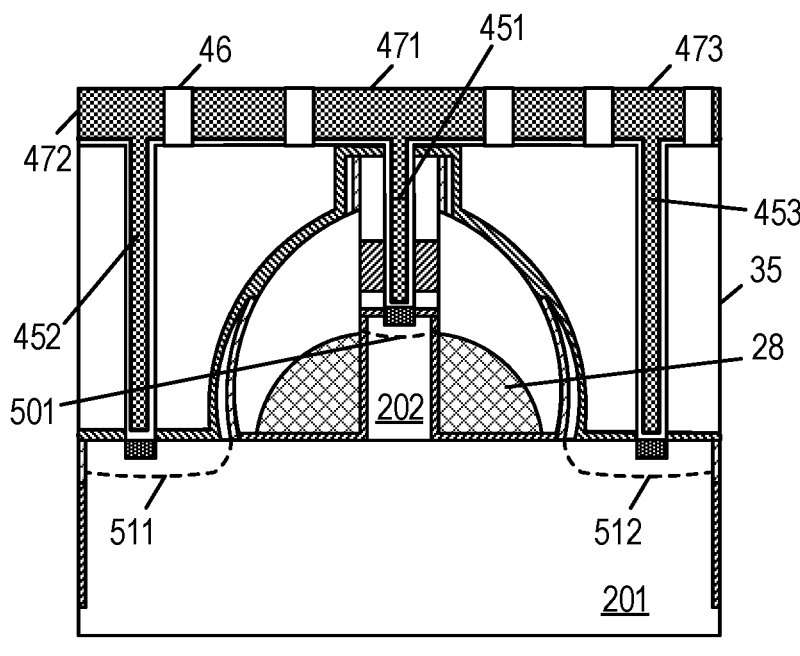
Figure 2Y:
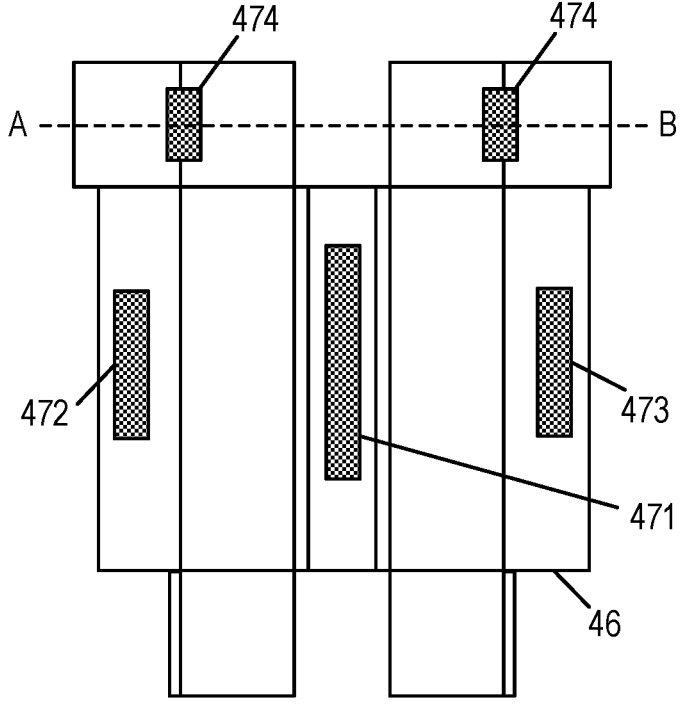
Figure 2Z:
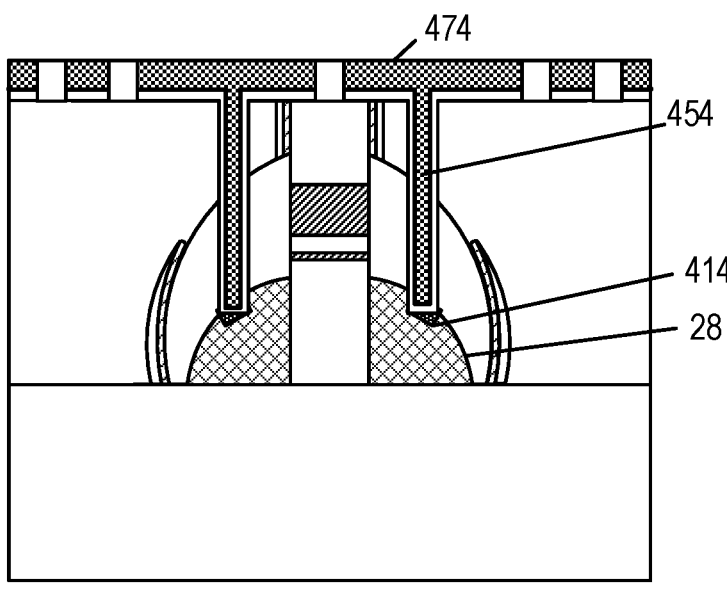

By filling a conductive material into the first through hole 391, the second through hole 392, the third through hole 393 and the fourth through holes, a first plug 451 electrically connected to the first lightly doped region 501, a second plug 452 electrically connected to the first doped region 511, a third plug 453 electrically connected to the second doped region 512, and fourth plugs 454 electrically connected to the gate electrode 28 are formed, as shown in FIGS. 2X and 2Z.

In some embodiments, the formation of a first plug 451 electrically connected to the first lightly doped region 501, a second plug 452 electrically connected to the first doped region 511, a third plug 453 electrically connected to the second doped region 512 and fourth plugs 454 electrically connected to the gate electrode 28 includes specifically the following operations.

A first contact layer 411 is formed at a bottom of the first through hole 391, a second contact layer 412 is formed at a bottom of the second through hole 392, a third contact layer 413 is formed at a bottom of the third through hole 393 and fourth contact layers 414 are formed at bottoms of the fourth through holes.

A first diffusion barrier layer is formed on a surface of the first contact layer 411 and an inner wall of the first through hole 391, a second diffusion barrier layer is formed on a surface of the second contact layer 412 and an inner wall of the second through hole 392, a third diffusion barrier layer is formed on a surface of the third contact layer 413 and an inner wall of the third through hole 393, and fourth diffusion barrier layers are formed on surfaces of the fourth contact layers 414 and inner walls of the fourth through holes.

By filling the conductive material into the first through hole 391, the second through hole 392, the third through hole 393 and the fourth through holes, the first plug 451 on the first diffusion barrier layer, the second plug 452 on the second diffusion barrier layer, the third plug 453 on the third diffusion barrier layer, and the fourth plugs 454 on the fourth diffusion barrier layers are formed.

Specifically, after forming the first doped region 511 and the second doped region 512, a nitride material (e.g. silicon nitride) is deposited on the surface of the insulating layer, the surface of the body part 201, the surface of the second isolation layer 33 and the surface of the first dielectric layer 30 to form a third isolation layer 34, as shown in FIG. 2N. Next, an oxide material (e.g. silicon dioxide) is deposited on a surface of the third isolation layer 34 to form a second dielectric layer 35 as shown in FIG. 2O. The second dielectric layer 35 is planarized by a chemical mechanical polishing process to expose the third isolation layer 34 as shown in FIG. 2P. Then, a third sub-mask layer 36 is formed on the surface of the second dielectric layer 35 and the exposed surface of the third isolation layer 34. A fourth sub-mask layer 37 is formed on a surface of the third sub-mask layer 36. A patterned second photoresist layer 38 is formed on a surface of the fourth sub-mask layer 37. The second photoresist layer 38 has a first etching window 381, a second etching window 382, a third etching window 383, and fourth etching windows (not shown in FIG. 2Q), as shown in FIG. 2Q. By etching down along the first etching window 381, the second etching window 382, the third etching window 383 and the fourth etching windows, a first through hole 391 exposing the first lightly doped region 501 in the protrusion part 202, a second through hole 392 exposing the first doped region 511 in the body part 201, a third through hole 393 exposing the second doped region 512 in the body part, and fourth through holes exposing the gate electrode 28 are formed. After removing the second photoresist layer 38, the third sub-mask layer 36 and the fourth sub-mask layer 37, a structure as shown in FIG. 2R is obtained.

A metallic material 40 (e.g. cobalt) is deposited in the first through hole 391, the second through hole 392, the third through hole 393, and the fourth through holes, as shown in FIG. 2S. The metal material 40 reacts with the material of the substrate (e.g. silicon) to form a metal silicide so that a first contact layer 411 is formed at the bottom of the first through hole 391, a second contact layer 412 is formed at the bottom of the second through hole 392, a third contact layer 413 is formed at the bottom of the third through hole 393, and fourth contact layers 414 are formed at the bottoms of the fourth through holes. With metal silicide as contact layers, a contact resistance in the through holes can be reduced. After stripping the remaining metallic material, a structure as shown in FIG. 2T is obtained.

Then, by depositing a metallic Ti material layer 42 on the inner wall of the first through hole 391, on the inner wall of the second through hole 392, on the inner wall of the third through hole 393, on the inner walls of the fourth through holes and on the surface of the second dielectric layer 35, a first adhesive layer covering the inner wall of the first through hole 391, a second adhesive layer covering the inner wall of the second through hole 392, a third adhesive layer covering the inner wall of the third through hole 393, and fourth adhesive layers covering the inner walls of the fourth through holes (not shown in FIG. 2U) are formed, as shown in FIG. 2U.

Next, by depositing a TiN material layer 43 on a surface of the metal Ti material layer 42, a first diffusion barrier layer covering a surface of the first adhesive layer, a second diffusion barrier layer covering a surface of the second adhesive layer, a third diffusion barrier layer covering a surface of the third adhesive layer, and fourth diffusion barrier layers covering surfaces of the fourth adhesive layers are formed, as shown in FIG. 2V.

Then, a metallic material layer 44 of such as tungsten is deposited in the first through hole 391, the second through hole 392, the third through hole 393, the fourth through holes, and on a surface of the TiN material layer 43. The metallic material layer 44 located in the first through hole 391 serves as the first plug 451, the metal material layer 44 located in the second through hole 392 serves as the second plug 452, and the metal material layer 44 located in the third through hole 393 serves as the third plug 453, as shown in FIG. 2W. The metallic material layers 44 located in the fourth through holes serve as the fourth plugs 454, as shown in FIG. 2Z. Next, by etching the metallic material layer 44 on the surface of the second dielectric layer 35, a first metal interconnect layer 471 for transmitting an electrical signal to the first lightly doped region 501, a second metal interconnect layer 472 for transmitting an electrical signal to the first doped region 511, a third metal interconnect layer 473 for transmitting an electrical signal to the second doped region 512, and fourth metal interconnect layers 474 for transmitting electrical signals to the gate electrode 28 are formed. The first metal interconnect layer 471, the second metal interconnect layer 472, the third metal interconnect layer 473, and the fourth metal interconnect layers 474 are electrically isolated from each other by spacers 46, as shown in FIG. 2X. FIG. 2Y is a schematic top-view structural diagram of FIG. 2X. FIG. 2Z is a schematic cross-sectional diagram of FIG. 2Y in an AB direction.

In some embodiments, the plurality of fourth plugs 454 are distributed around a periphery of a same gate electrode 28 and are all electrically connected to the same gate electrode 28.

Specifically, by arranging the plurality of the fourth plugs 454 to be electrically connected to the same gate electrode 28, a parasitic capacitance effect between the fourth plugs 454 and the gate electrode 28 can also be mitigated on the premise of ensuring a stable connection between the fourth plugs 454 and the gate electrode 28.

Figure 3A:
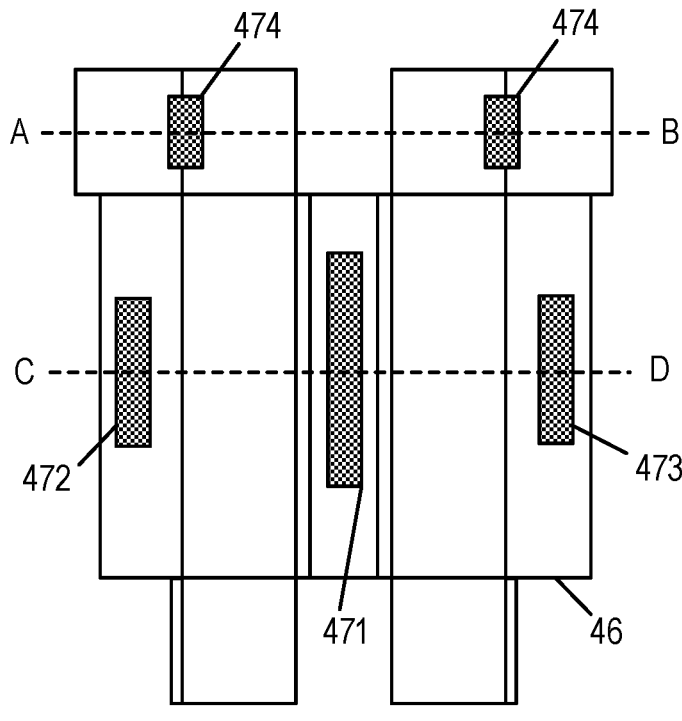
FIGS. 3A-3C are schematic diagrams of a semiconductor structure in a specific implementation of the disclosure.
Figures 3B, 3C:
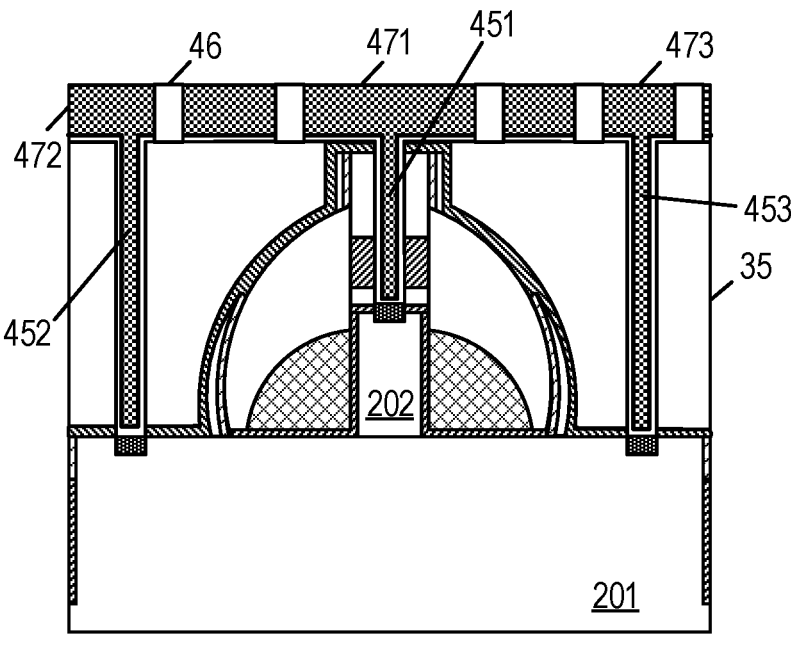

According to some embodiments of the disclosure, in another aspect, the disclosure provides a semiconductor structure. FIGS. 3A-3C are schematic diagrams of a semiconductor structure in a specific implementation of the disclosure. FIG. 3B is a schematic cross-sectional diagram of FIG. 3A along a CD direction. FIG. 3C is a schematic cross-sectional diagram of FIG. 3A along an AB direction. The semiconductor structure provided in the specific implementation may be formed by the method for forming a semiconductor structure shown in FIGS. 1 and 2A-2Z. As shown in FIGS. 2A-2Z and 3A-3C, the semiconductor structure includes: a substrate, a gate electrode 28, a first doped region 511 and a second doped region 512.

The substrate includes a body part 201 and a protrusion part 202 on a surface of the body part 201.

The gate electrode 28 is located on the body part 201 and is distributed around sidewalls of the protrusion part 202.

The first doped region 511 is located in the body part 201.

The second doped region 512 is located in the body part 201. The first doped region 511 and the second doped region 512 are distributed at two opposite sides of the gate electrode 28.

In some embodiments, the semiconductor structure further includes a first lightly doped region 501 located in the protrusion part 202 and second lightly doped regions 502 located in the body part 201 at two opposite sides of the protrusion part 202.

In some embodiments, projections of the second lightly doped regions 502 partially overlap with a projection of the first doped region 511 and a projection of the second doped region 512 respectively in a direction perpendicular to the surface of the body part 201.

In some embodiments, the semiconductor structure further includes a first plug 451, a second plug 452, a third plug 453 and fourth plugs 454.

The first plug 451 extends in the direction perpendicular to the surface of the body part 201 and is electrically connected to the first lightly doped region 50.

The second plug 452 extends in the direction perpendicular to the surface of the body part 201 and is electrically connected to the first doped region 511.

The third plug 453 extends in the direction perpendicular to the surface of the body part 201 and is electrically connected to the second doped region 512.

The fourth plugs 454 extend in the direction perpendicular to the surface of the body part 201 and are electrically connected to the gate electrode 28.

In some embodiments, the plurality of fourth plugs 454 are distributed around a periphery of a same gate electrode 28 and are all electrically connected to the same gate electrode 28.

In some embodiments, the semiconductor structure further includes a first contact layer 411, a second contact layer 412, a third contact layer 413 and fourth contact layers 414.

The first contact layer 411 is located between the first lightly doped region 501 and the first plug 451.

The second contact layer 412 is located between the first doped region 511 and the second plug 452.

The third contact layer 413 is located between the second doped region 512 and the third plug 453.

Each of the fourth contact layers 414 is located between the gate electrode 28 and a corresponding one of the fourth plugs 454.

In some embodiments, a material of the substrate is silicon, and a material of the gate electrode 28 is polysilicon.

Materials of the first contact layer 411, the second contact layer 412, the third contact layer 413 and the fourth contact layers 414 are all metal silicide.

In some embodiments, the semiconductor structure further includes an insulating layer.

The insulating layer covers a top surface of the protrusion part 202. The first plug 415 penetrates the insulating layer in the direction perpendicular to the surface of the body part 201.

In some embodiments, the semiconductor structure further includes a first dielectric layer 30 and a second dielectric layer 35.

The first dielectric layer 30 covers the surface of the gate electrode 28.

The second dielectric layer 35 covers the surface of the body part 201, a surface of the first dielectric layer 30 and the surface of the insulating layer. Both the second plug 452 and the third plug 453 penetrate the second dielectric layer in the direction perpendicular to the surface of the body part. The fourth plugs 454 penetrate the first dielectric layer 30 in the direction perpendicular to the surface of the body part 201.

In some embodiments, a height of the protrusion part 202 in the direction perpendicular to the surface of the body part 201 is greater than a width of the protrusion part 202 in a direction parallel to the surface of the body part 201.

In some embodiments, a height of the gate electrode 28 is smaller than a height of the protrusion part 202 in the direction perpendicular to the surface of the body part 201.

In some embodiments, the height of the protrusion part 202 is 30 nm to 100 nm.

In the semiconductor structure and the method for forming the same provided by the specific implementation, by forming the substrate that includes the body part and the protrusion part, arranging the gate electrode around the periphery of the protrusion part, and arranging a first doped region and a second doped region to be distributed in the body part at either side of the gate electrode, a channel length of the MOS device having the gate electrode, the first doped region and the second doped region is increased, a short-channel effect and a leakage current are reduced, and thus an electrical performance and a yield of the semiconductor structure are improved. Moreover, an area of the channel in the MOS device is increased, and a threshold voltage offset of the MOS device caused by a process deviation is reduced, which are helpful to further reduce the size of the MOS device.

The above are only the preferred implementations of the disclosure. it is be noted that for those skilled in the art, without departing from the principles of the disclosure, several improvements and modifications may be made, which shall also be considered to fall within the scope of protection of the disclosure.

The invention claimed is:

1. A method for forming a semiconductor structure, comprising:
    forming a substrate, wherein the substrate comprises a body part and a protrusion part located on a surface of the body part;
    forming a gate electrode located on the body part and distributed around sidewalls of the protrusion part; and
    forming a first doped region and a second doped region located in the body part and distributed at two opposite sides of the gate electrode;
    before forming the first doped region and the second doped region located in the body part and distributed at the two opposite sides of the gate electrode,
    forming a first dielectric layer covering the gate electrode; and
    implanting a first doping ion into the body part at two opposite sides of the protrusion part to form second lightly doped regions;
    after forming the first doped region and the second doped region located in the body part and distributed at the two opposite sides of the gate electrode,
    forming a second dielectric layer covering the surface of the body part, a surface of the first dielectric layer, and a surface of the insulating layer;
    etching the second dielectric layer, the first dielectric layer and the insulating layer to form a first through hole exposing the first lightly doped region in the protrusion part, a second through hole exposing the first doped region in the body part, a third through hole exposing the second doped region in the body part, and fourth through holes exposing the gate electrode; and
    forming a first plug electrically connected to the first lightly doped region, a second plug electrically connected to the first doped region, a third plug electrically connected to the second doped region, and fourth plugs electrically connected to the gate electrode by filling a conductive material into the first through hole, the second through hole, the third through hole and the fourth through holes.

2. The method for forming a semiconductor structure of claim 1, wherein
    the forming a substrate comprises:
    providing an initial substrate, wherein the initial substrate comprises a first lightly doped region;
    forming an initial insulating layer covering a surface of the initial substrate; and
    forming the substrate comprising the body part and the protrusion part located on the surface of the body part, and an insulating layer on a surface of the protrusion part, by etching the initial insulating layer and the initial substrate, wherein the protrusion part comprises the first lightly doped region, and the body part does not comprise the first lightly doped region.

3. The method for forming a semiconductor structure of claim 2, wherein the forming a gate electrode located on the body part and distributed around sidewalls of the protrusion part comprises:

forming a gate dielectric layer covering a sidewall of the protrusion part and part of the surface of the body part; and forming the gate electrode located on a surface of the gate dielectric layer and distributed around the sidewalls of the protrusion part.

4. The method for forming a semiconductor structure of claim 3, wherein the forming the gate electrode located on a surface of the gate dielectric layer and distributed around the sidewalls of the protrusion part comprises:

depositing a gate material layer on the surface of the gate dielectric layer and a surface of the insulating layer; and removing all the gate material layer on the surface of the insulating layer and part of the gate material layer above the body part, such that the gate material layer remaining on the surface of the gate dielectric layer and distributed around the sidewall s of the protrusion part forms the gate electrode.

5. The method for forming a semiconductor structure of claim 1, wherein the forming a first doped region and a second doped region located in the body part and distributed at two opposite sides of the gate electrode comprises:

implanting a second doping ion into the body part at the two opposite sides of the protrusion part to form the first doped region and the second doped region respectively in the body part at the two opposite sides of the gate electrode;

wherein projections of the second light doped regions partially overlap with a projection of the first doped region and a projection of the second doped region respectively in a direction perpendicular to the surface of the body part.

6. The method for forming a semiconductor structure of claim 1, wherein the forming a first plug electrically connected to the first lightly doped region, a second plug electrically connected to the first doped region, a third plug electrically connected to the second doped region, and fourth plugs electrically connected to the gate electrode comprises:

forming a first contact layer at a bottom of the first through hole, forming a second contact layer at a bottom of the second through hole, forming a third contact layer at a bottom of the third through hole and forming fourth contact layers at bottoms of the fourth through holes;

forming a first diffusion barrier layer on a surface of the first contact layer and an inner wall of the first through hole, forming a second diffusion barrier layer on a surface of the second contact layer and an inner wall of the second through hole, forming a third diffusion barrier layer on a surface of the third contact layer and an inner wall of the third through hole, and forming fourth diffusion barrier layers on surfaces of the fourth contact layers and inner walls of the fourth through holes; and forming the first plug on the first diffusion barrier layer, the second plug on the second diffusion barrier layer, the third plug on the third diffusion barrier layer, and the fourth plugs on the fourth diffusion barrier layers by filling the conductive material into the first through hole, the second through hole, the third through hole and the fourth through holes.

7. The method for forming a semiconductor structure of claim 1, wherein a plurality of the fourth plugs are distributed around a periphery of a same gate electrode and are all electrically connected to the same gate electrode.

8. The method for forming a semiconductor structure of claim 1, wherein a height of the gate electrode is smaller than a height of the protrusion part in a direction perpendicular to the surface of the body part.

9. A semiconductor structure, comprising: a substrate comprising a body part and a protrusion part located on a surface of the body part; a gate electrode located on the body part and distributed around sidewalls of the protrusion part; a first doped region located in the body part; and a second doped region located in the body part, wherein the first doped region and the second doped region are distributed at two opposite sides of the gate electrode; a first lightly doped region located in the protrusion part and second lightly doped regions located in the body part at two opposite sides of the protrusion part, wherein projections of the second light doped regions partially overlap with a projection of the first doped region and a projection of the second doped region respectively in a direction perpendicular to the surface of the body part; a first plug extending in the direction perpendicular to the surface of the body part and electrically connected to the first lightly doped region; a second plug extending in the direction perpendicular to the surface of the body part and electrically connected to the first doped region; a third plug extending in the direction perpendicular to the surface of the body part and electrically connected to the second doped region; and fourth plugs extending in the direction perpendicular to the surface of the body part and electrically connected to the gate electrode.

10. The semiconductor structure of claim 9, wherein a plurality of the fourth plugs are distributed around a periphery of a same gate electrode and are all electrically connected to the same gate electrode.

11. The semiconductor structure of claim 9, further comprising:

a first contact layer located between the first lightly doped region and the first plug;

a second contact layer located between the first doped region and the second plug;

a third contact layer located between the second doped region and the third plug; and fourth contact layers located between the gate electrode and the fourth plugs.

12. The semiconductor structure of claim 9, further comprising:

an insulating layer covering a top surface of the protrusion part, wherein the first plug penetrates through the insulating layer in the direction perpendicular to the surface of the body part.

13. The semiconductor structure of claim 12, further comprising:

a first dielectric layer covering a surface of the gate electrode; and a second dielectric layer covering the surface of the body part, a surface of the first dielectric layer and a surface of the insulating layer, wherein both the second plug and the third plug penetrate through the second dielectric layer in the direction perpendicular to the surface of the body part, and the fourth plugs penetrate through the first dielectric layer in the direction perpendicular to the surface of the body part.

14. The semiconductor structure of claim 9, wherein a height of the protrusion part in a direction perpendicular to the surface of the body part is greater than a width of the protrusion part in a direction parallel to the surface of the body part.

15. The semiconductor structure of claim 9, wherein a height of the gate electrode is smaller than a height of the protrusion part in a direction perpendicular to the surface of the body part.

* * * * *